THERMOELECTRIC DEVICES AND THERMOELEMENTS

Filed Nov. 21, 1958

INVENTORS
RUSSELL E. FREDRICK
ROBERT W. FRITTS
BY
Carpenter Abbott Coulter and Kinney
ATTORNEYS United States Patent Office 3,051,767

Patented Aug. 28, 1962

3,051,767

THERMOELECTRIC DEVICES AND THERMOELEMENTS

Russell E. Fredrick, White Bear Lake, and Robert W. Fritts, Arden Hills, Minn., assignors to Minnesota Mining and Manufacturing Company, St. Paul, Minn., a corporation of Delaware Filed Nov. 21, 1958, Ser. No. 775,529
15 Claims. (Cl. 136—5)

This invention relates to improvements in thermoelectric devices and thermoelements for such devices.

In thermoelectric devices, including both thermoelectric generators and thermoelectric heat pumps, high thermoelectric conversion efficiency requires that the thermoelements of the device be characterized by high thermoelectric power; low electrical resistivity and low thermal conductivity. Theory shows that an excellent measure of the value of a given material for use in thermoelectric devices is the parameter known as the "figure of merit" or $S^2/K\rho$, in which:

$S$=Seebeck coefficient
$K$=thermal conductivity
$\rho$=electrical resistivity

While certain semiconducting materials have been found to exhibit high figures of merit, experience has shown that the figure of merit of thermoelectric materials varies widely with changes in temperature. The figure of merit data heretofore available was gathered largely in the vicinity of room temperature and therefore does not indicate the figure of merit of the materials when used for thermoelectric elements of devices which operate over wide ranges of temperature or under large temperature differentials.

For efficient operation of a thermoelectric generator, it is necessary that the thermoelements thereof be operated at relatively high hot junction temperatures and relatively low cold junction temperatures in order to obtain as high a Carnot efficiency factor, $\Delta T/T$, as possible. For maximum thermoelectric conversion efficiency, the materials of the thermoelements should exhibit as high a figure of merit as possible within the entire range of temperatures to be encountered.

Many classes of alloys and intermetallic compounds have been prepared and tested, and no singular P-type or N-type composition has been found to exhibit as high a figure of merit over as wide a range of temperatures as is desired for efficient thermoelectric generation. Moreover certain materials which exhibit desirable figure of merit characteristics at moderate or low temperatures tend to melt or become chemically unstable at relatively high hot junction temperatures.

With the above in mind it is therefore a general object of the present invention to provide an improved thermoelectric device adapted for highly efficient operation at relatively high hot junction temperatures and relatively low cold junction temperatures.

Another object of the invention is to provide in a thermoelectric device of the aforementioned character at least one thermoelement comprising portions or segments formed respectively of different thermoelectric materials, each of said materials being characterized by a high figure of merit for, and a sufficiently high melting point for safe operation within, the temperature range in which it is to operate.

Other and further objects of the invention will become apparent as the description proceeds, reference being had to the drawing accompaning and forming a part of this specification in which.

Figures 1, 2, 3:
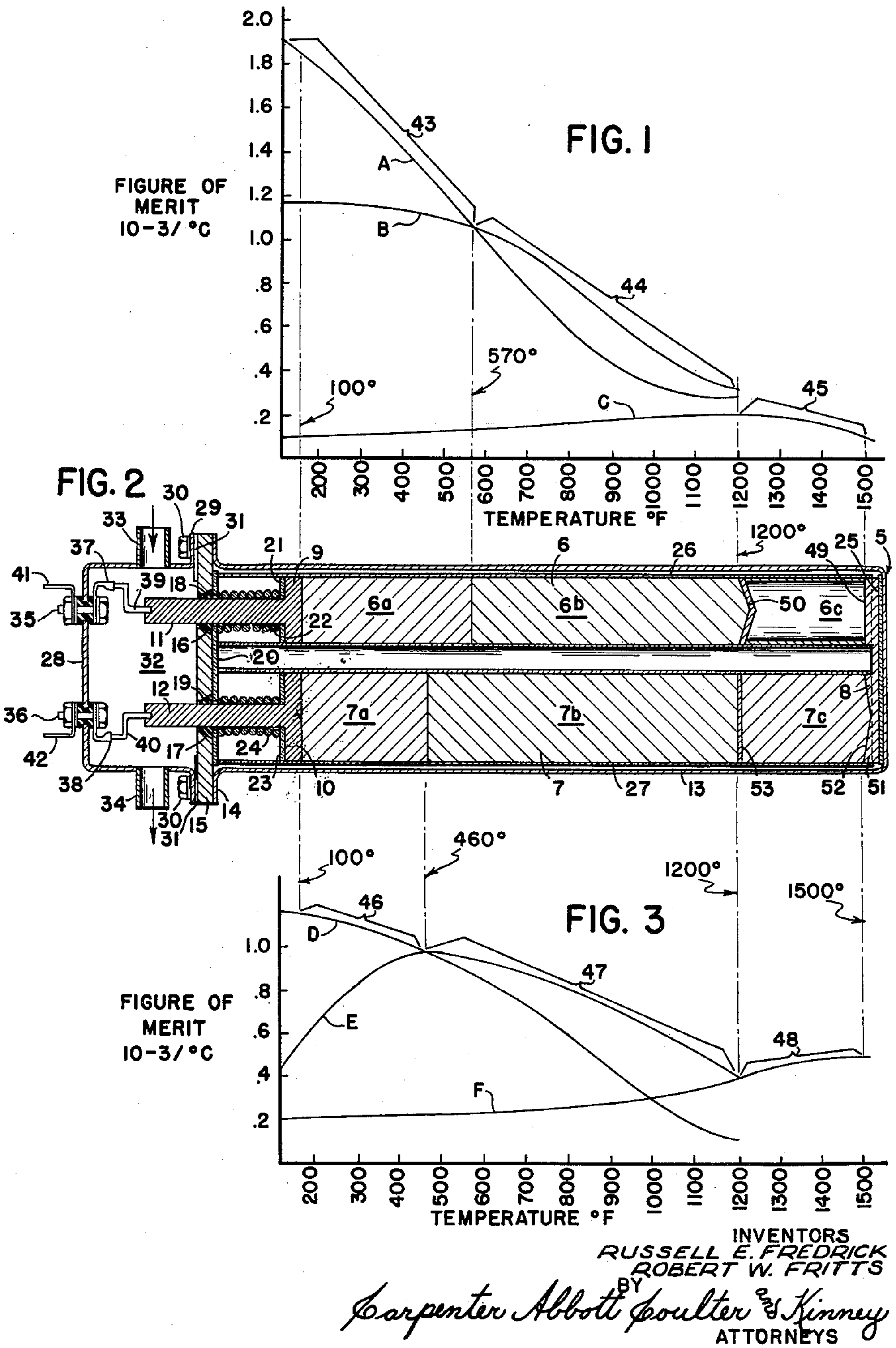
FIGURE 1 is a graphic illustration showing the figure of merit versus temperature curves of several N-type thermoelectric materials.
FIGURE 2 is a fragmentary longitudinal sectional view of a thermoelectric device constructed according to the principles of the present invention.
FIGURE 3 is a graphic illustration showing the figure of merit versus temperature curves of several P-type thermoelectric compositions.

Referring now to FIGURE 2 of the drawing, the thermoelectric device selected for illustration of the inventive concept takes the form of a thermoelectric generator indicated generally by the numeral 5. The generator 5 comprises an N-type thermoelement 6 and P-type thermoelement 7 electrically joined at one end, as by a thermojunction member 8 to form a thermoelectric junction. The opposite ends of the elements 6 and 7 are electrically joined respectively to contact electrode or thermojunction members 9 and 10 having elongated stem portions 11 and 12 respectively.

A generally cup-shaped casing member 13, preferably of stainless steel, surrounds the thermoelements 6 and 7 as shown and is formed with an outturned annular flange 14. A plate 15, preferably of stainless steel is in registry with the flange 14 and is sealingly joined thereto as by welding. The plate 15 is formed with conical bores 16 and 17 through which the electrode stems 11 and 12 project in coaxial spaced relation. Surrounding the stems 11 and 12 within the conical bores 16 and 17 are resilient rubber-like O-rings 18 and 19, and overlaying the plate 15 within the casing 13 is a layer 20 of insulating material suitably apertured to receive the stems 11 and 12 as shown.

An insulating washer 21 surrounds the contact electrode stem 11, and also surrounding said stem, with its opposite ends in abutting engagement with the layer 20 and washer 21, is a helical compression spring 22. An insulating washer 23 surrounds the contact electrode stem 12, and also surrounding said stem, with its opposite ends in abutting engagement with the layer 20 and washer 23, is a helical compression spring 24. Interposed between the thermojunction member 8 and the adjacent end wall of the casing member 13 is a thin layer 25 of electrical insulating material having relatively good thermal conductivity, for example mica. The illustrated thermoelements 6 and 7 are cylindrical in shape and have a snug fit coaxially within sleeves 26 and 27 of electrical insulating material, for example mica.

The generator 5 is adapted for operation with a substantial temperature differential across the thermoelements 6 and 7 thereof, there being relatively high temperatures at the ends thereof adjacent the thermojunction member 8. To afford these higher temperatures, the portion of the casing 13 adjacent the thermojunction member 8, and more particularly the end wall thereof, is exposed to a suitable source of heat (not shown) which raises the temperature of the junctions between thermojunction member 8 and elements 6 and 7 to 1500° F. To afford relatively low temperatures, i.e. of about 100° F., at the junctions of the thermoelements 6 and 7 with the contact electrodes 9 and 10, means is provided for cooling the electrode stems 11 and 12. The cooling means referred to comprises a generally cup-shaped casing member 28 having an outturned annular flange 29 in registry with the plate 15 and sealingly affixed, as by screws 30 and a gasket 31, to the side of said plate facing away from the casing member 13. The casing 28 affords a chamber 32 into which the contact electrode stems 11 and 12 project as shown. The casing 28 is provided with inlet and outlet connections 33 and 34 for attachment to supply and return conduits of a system (not shown) for circulating a fluid coolant through the chamber 32. The coolant used is preferably an electrically nonconducting liquid, for example ethylene glycol.

Electrical connections for the generator 5 are provided by terminals 35 and 36 insulatably and sealingly projecting through suitable apertures in the housing 28. The terminals 35 and 36 are provided with internal lugs 37 and 38, there being a flexible electrical conductor 39 connecting the electrode stem 11 in circuit with the lug 37 and a similar conductor 40 connecting the electrode stem 12 in circuit with the lug 38. Terminals 35 and 36 are also provided with external lugs 41 and 42 respectively for connection of the generator 5 into a load circuit (not shown).

In the illustrated generator 5, thermoelement 6 is made of material having N-type electrical conductivity, and the thermoelement 7 is made of material having P-type electrical conductivity so that said elements afford a P–N thermocouple. Heretofore unobtainable efficiency is imparted to the generator 5 by the novel construction of the thermoelements 6 and 7 whereby said thermoelements comprise portions or segments formed respectively of a plurality of different thermoelectric materials each of which has a figure of merit superior to that of any other material in the same thermoelement for the operating temperatures encountered by the respective portion or segment. As shown in FIGURE 2 the thermoelement 6 is formed of portions or segments *6a*, *6b* and *6c* respectively, and the thermoelement 7 is formed of portions or segments *7a*, *7b* and *7c* respectively.

In order to determine which material should be selected for a given portion or segment of the thermoelements 6 and 7, as well as the subgradient within the overall temperature gradient across the elements within which a given portion or segment should operate in accordance with the inventive concept, separate plots are made of the figure of merit versus temperature curves of a number of known P and N type thermoelectrical materials. FIGURES 1 and 3 respectively show the figure of merit versus temperature curves of the materials actually used in the thermoelements 6 and 7. While in carrying out the method of selecting the thermoelectric materials for use in a given thermoelectric device the figure of merit curves for a larger number of materials than those shown in FIGURES 1 and 3 are ordinarily plotted, for the sake of clarity, only the curves of the materials selected for use in the device 5 are shown.

Referring to FIGURE 1 the curves A, B, and C represent the figure of merit versus temperature characteristics of the materials used in the portions or segments *6a*, *6b* and *6c* respectively. In FIGURE 3 the curves D, E and F represent the figure of merit versus temperature characteristics of the materials used in the portions or segments *7a*, *7b* and *7c* respectively. It will be observed by reference to FIGURE 1 that within the temperature range of from 100 to approximately 570° F. the curve A represents a figure of merit superior to that of the curves B and C, and that within the temperature range of from approximately 570 to 1200° F., the latter temperature being the maximum safe operating temperature of the materials of portions or segments *6a* and *6b*, the curve B represents a figure of merit superior to those of the curves A and C. The family of curves A, B and C thus generate a maximum figure of merit versus temperature curve comprising increment 43 from curve A, increment 44 from curve B, and increment 45 from curve C. By reference to FIGURE 3 it will be observed that the curves D, E and F similarly generate a maximum figure of merit versus temperature curve comprising increment 46 from curve D, increment 47 from curve E and increment 48 from curve F. In effect the selection of the materials producing the most efficient thermoelement amounts to finding which combination of materials provides the maximum figure of merit versus temperature curve, i.e. the curve having the greatest area thereunder for a given family of curves representing materials of like conductivity type.

The plot of FIGURE 1 thus indicates that in order to produce from the materials represented by the curves A, B and C, the most efficient thermoelement 6 for operation at the indicated operating temperatures of the device 5, said thermoelement should be so constructed that the portion thereof subjected to the subgradient corresponding to the increment 43, i.e. the temperature range of 100 to 570° F., should be formed of the material represented by the curve A; the portion subjected to the subgradient corresponding to the increment 44, i.e. the temperature range of from 570 to 1200° F., should be formed of the material represented by the curve B; and the portion subjected to the subgradient corresponding to the increment 45, i.e. the temperature range of from 1200 to 1500° F., should be formed of the material represented by the curve C. In accordance with these indications, the portions or segments *6a*, *6b* and *6c* are formed of the materials represented by the curves A, B and C respectively and are so dimensioned that when the device 5 is subjected to the indicated overall temperature gradient, said portions or segments are subjected to the aforementioned respective subgradients corresponding to the increments 43, 44 and 45.

With reference to FIGURE 3 it will similarly be observed that in order to produce from the materials represented by the curves D, E and F, the most efficient thermoelement 7 for operation at the indicated operating temperatures of the device 5, said thermoelement should be so constructed that the portion thereof subjected to the subgradient corresponding to the increment 46, i.e. the temperature range of from 100 to 460° F., should be formed of the material represented by the curve D; the portion subjected to the subgradient corresponding to the increment 47, i.e. the temperature range of from 460 to 1200° F., should be formed of the material represented by the curve E; and the portion subjected to the subgradient corresponding to the increment 48, i.e. the temperature range of from 1200 to 1500° F., should be formed of the material represented by the curve F. In accordance with these indications the portions or segments *7a*, *7b* and *7c* are formed of the materials represented by the curves D, E and F respectively, and are so dimensioned that when the device 5 is subjected to the indicated overall temperature gradient, said portions or segments are subjected to the aforementioned respective subgradients corresponding to the increments 46, 47 and 48.

Alloys of lead and at least one of tellurium, selenium or sulphur compositions are good low and medium temperature thermoelectric materials suitable for use in the portions or segments *6a*, *6b*, *7a* and *7b*. Constantan, an alloy comprising 43% nickel and 57% copper, is a high temperature N-type thermoelectric material suitable for use in the portion or segment *6c*. Manganese-tellurium alloys are good high temperature P-type thermoelectric materials suitable for use in the portion or segment *7c*.

In FIGURE 1 the curve A represents the figure of merit versus temperature charcteristics of an N-type semiconductor material consisting essentially of a base composition of from 61.95 to 63.0% by weight lead, the balance being substantially all tellurium, and having in addition thereto bismuth as a promoter in the amount of 0.1% by weight of the base composition. The curve B represents the figure of merit versus temperature characteristics of an N-type semiconductor material having the same base composition as the material represented by the curve A, and has in addition thereto bismuth as a promoter in the amount of 0.2% by weight of the base composition. The curve D represents a P-type semiconductor material consisting essentially of a base composition of 59.0% to 61.8% by weight lead, the balance being substantially all tellurium, and having in addition thereto sodium as a promoter in the amount of .021% by weight of said base composition. The curve E represents a P-type semiconductor material consisting of the same base composition as the material represented by the curve D, and has in addition thereto sodium as a promoter in the amount of 0.069% by weight of said base composition.

The curves A and B and D and E illustrate that by the addition of varying amounts of promoter to a given semiconductor base composition, resulting promoted compositions are produced which have different figure of merit versus temperature characteristics. The promoters produce these variations by effecting substantial changes in carrier concentration in the semiconductor composition. Thus, it is possible to produce a highly efficient thermoelement in which the major portion thereof is formed from a single base composition having portions or segments of the length thereof each containing a different quantity or species of promoter affording the respective portion or segment figure of merit characteristics superior to those of any other portion or segment of the element for the temperature range to which it is exposed during operation.

The improved thermoelement construction not only provides for use in a single thermoelement of portions or segments of materials chosen for their superior figure of merit characteristics at certain temperatures, but it also permits the use in a single thermoelement of materials which are chosen for their chemical stability and resistance to melting at certain temperatures within the operating range of the thermoelement. Thus, for high temperature resistance constantan is chosen for the portion or segment *6c* of the element 6. High temperature resistance is also one of the reasons that the manganese-tellurium alloy is chosen for the portion or segment *7c*.

In the formation of the N-type thermoelements, it is preferred to use for low and medium temperature applications the promoted alloys of lead and at least one of tellurium, selenium and sulphur disclosed in Fritts and Karrer Patents Nos. 2,811,440, 2,811,720 and 2,811,721. Patent No. 2,811,440 discloses a base composition of 61.95% to 63.0% by weight lead, balance substantially all tellurium, to which has been added a minor amount of one of the following promoters: aluminum, bismuth, bromine, chlorine, gallium, iodine, manganese, tantalum, titanium, and zirconium. Patent No. 2,811,720 discloses a base composition consisting essentially of 72.45% to 73.50% lead, balance substantially all selenium, to which has been added a minor amount of one of the following promoters: aluminum, antimony, bismuth, bromine, chlorine, columbium, copper, fluorine, gallium, gold, iodine, indium, silicon, tantalum, titanium and zirconium. Patent No. 2811,721 discloses a base composition consisting essentially of 86.63% to 87.10% by weight lead, balance substantially all sulphur, to which has been added a minor amount of one of the following promoters: antimony, bismuth, bromine, chlorine, columbium, gallium, iodine, indium, tantalum, titanium, uranium and zirconium.

In the formation of P-type thermoelements it is preferred to use for low and medium temperature applications the promoted alloys of lead and tellurium disclosed in Fritts and Karrer Patent No. 2,811,441. This patent discloses a base composition consisting essentially of 59.0% to 61.8% by weight lead, balance substantially all tellurium, to which has been added a minor amount of one of the following promoters: sodium, potassium and thallium. The high temperature P-type materials preferred for use in the element 7 are preferably those disclosed in Russell E. Fredrick and Clarence R. Manser, Patent No. 2,890,260, granted June 9, 1959, and assigned to the asignee of the present invention. The Fredrick and Manser application discloses a base composition consisting essentially of 69.9% to 72.0% by weight tellurium, balance substantially all manganese, to which has been aded a minor amount of sodium or lithium.

The contact electrodes 9 and 10, as well as the thermojunction member 8, are preferably of iron as disclosed in Fredrick et al. Patent No. 2,811,569. The constantan portion or segment *6c* is tubular and is preferably of the same diameter as a cylindrical boss 49 formed on the thermojunction member 8 and to which it is fixed in coaxial relationship as by welding. The opposite end of the constantan tube *6c* is closed by a concavo-convex iron contact electrode 50 fixed thereto as by welding. The thermojunction member 8 is also formed with a cylindrical boss 51 which may have a conically tapered surface 52 engaged by a complementary end face of the portion or segment *7c* of thermoelement 7. The boss 51 is preferably of the same diameter as the thermoelement 7 so that the sleeve 27 has a snug coaxial fit thereon. Interposed between the portions or segments *7b* or *7c* is an iron contact electrode or disk 53.

The thermoelements 6 and 7 may be fabricated in a number of ways, however there are certain relationships which must be adhered to for satisfactory operation of said thermo-elements. Firstly, the adjacent portions or segments of an element must be compatible to the extent that no diffusion therebetween takes place tending to alter the electrical properties of either portion or segment. This requirement accounts for the presence of the iron contact disk 53 interposed between the lead telluride alloy *7b* and the manganese telluride alloy *7c*. Further, there must be no alloying of the materials of adjacent portions or segments tending to form low melting point eutectics. In addition to the compatibility of adjacent portions or segments as aforementioned, it is important that the electrical contact between adjacent portions or segments be of low resistance and ohmic in character.

The elements 6 and 7 may be made by forming discrete cylindrical segments of the semiconductor materials in the cylindrical shapes shown, the device 5 being thereafter assembled with the segments and contact electrodes held in low resistance pressure contact by means of the springs 22 and 24. The adjacent segments and contact electrodes may also be bonded to one another, for example by soldering with an intermediate alloy, or in the formation of the segments, casting one segment onto an adjacent segment where the materials are compatible.

Manufacturing methods may also be used in which adjacent portions or segments are formed in electrically joined relationship in a single operation. One such method involves the use of powdered metallurgy techniques in which, for example, powdered material for the portion *6b* is poured into a cylindrical mold on top of powdered material for the portion or segment *6a*, said powdered materials then being subjected to high pressure and to heat less than the melting point thereof to form the portions *6a* and *6b* as a unitary component of the thermoelement 6. In this connection the invention particularly comprehends the method of making a thermoelement having electrically joined portions formed of the same base composition and differing from one another in carrier concentration by virtue of the addition thereto of differing species or amounts of promoters.

In the assembly of the device 5, a gaseous reducing fill, for example methane, is placed within the casing 13 prior to sealing the flange 14 to the plate 15. The springs 22 and 24, in addition to exerting substantial compressive stress on the portions or segments of the elements 6 and 7, also afford, through the layer 20, compression of the O-rings 18 and 19 to afford a seal around the electrode stems 11 and 12. The insulating sleeves 26 and 27 aid in retaining the portions or segments of the elements 6 and 7 in proper assembled relation, particularly at the pressure contacts, and together with the compression afforded by the springs 22 and 24, lend substantial shock resistance to the elements 6 and 7. Further, the snug fit of the mica sleeves 26 and 27 on thermoelements 6 and 7 and on bosses 49 and 51 of thermojunction member 8 inherently tends to reduce sublimation of said elements which might tend to occur in the portions thereof adjacent said thermojunction member when subjected to elevated temperatures.

The substantially improved materials efficiency imparted to a thermoelectric device by the improved thermoelement construction is well illustrated by the following example:

Assume a first P–N thermocouple having a homogeneous N-type thermoelement of a lead-tellurium base alloy containing 37.95% tellurium and to which is added 0.2% bismuth, said thermocouple also having a homogeneous P-type thermoelement of a lead-tellurium base alloy containing 38.3% tellurium and to which has been added 0.069% sodium, said thermocouple also having a thermoelement area ratio $A_n/A_p$ of 0.813 and an operating temperature differential of 100° F. to 1000° F. Assume also a second P–N thermocouple having the same thermoelement ratio, the same overall operating temperature gradient and the same thermoelement base compositions. The N-type thermoelement of the second thermocouple has a segment of material containing 0.2% bismuth and sized to have a subgradient thereacross of 550° to 1000° F., said N-type thermoelement also having a segment of material containing 0.1% bismuth and sized to have a subgradient thereacross of 100° F. to 550° F. The P-type thermoelement of the second thermocouple has a segment of material containing 0.069% sodium and sized to have a subgradient thereacross of 450° F. to 1000° F., said P-type thermoelement also having a segment of material containing 0.021% sodium and sized to have a subgradient thereacross of 100° F. to 450° F.

The segmented element second thermocouple is found to have an average figure of merit of $1.06 \times 10^{-3}/°$ C. as compared with $0.88 \times 10^{-3}/°$ C. for the unsegmented element first thermocouple. As is indicated by a comparison of the average figure of merit values, the materials efficiency of the second thermocouple is substantially greater than that of the first thermocouple, the materials efficiency of the segmented element second couple being 9.0%, as compared with 7.3% for the unsegmented element first couple.

The particular form of the invention shown and described was selected to facilitate the disclosure only and is not intended to be limitative of the scope of the claims or to confine the invention to a particular use. The invention is equally applicable, for example, to other thermoelectric devices, such as thermopiles and thermoelectric heat pumps which are operable with relatively high temperature gradients across the elements thereof. Various changes and modifications suggest themselves to those skilled in the art, and all of such changes are contemplated as may come within the scope of the appended claims.

What is claimed as the invention is:

1. A thermoelectric element having spaced thermojunction means and adapted for operation with a predetermined temperature gradient thereacross between said thermojunction means, said element having substantially homogeneous segments formed of different active thermoelectric materials, the material of each of said segments having a figure of merit which is superior to that of any other of said materials for the temperature range within said gradient obtaining across said segment when said predetermined temperature gradient obtains across said element.

2. A thermoelectric element for operation with a predetermined temperature gradient between the extremities thereof, comprising substantially homogeneous segments of different active thermoelectric materials each having a figure of merit superior to that of any other of said materials at a predetermined different range of temperatures within said temperature gradient, said segments being electrically joined in such order that when said predetermined temperature gradient obtains across said element the temperature range within each segment includes a portion of the range in which the figure of merit of the material thereof is superior to that of any other of said materials.

3. A thermoelectric device for operation with a predetermined temperature gradient thereacross, comprising a first thermoelement having substantially homogeneous segments formed of different active thermoelectric materials, the material of each of said segments having a figure of merit which is superior to that of any other material in said thermoelement for the temperature range within said gradient obtaining across said segment when said predetermined temperature gradient obtains across said thermoelement, and a second thermoelement joined to said thermoelement to form a thermojunction.

4. A thermoelectric device comprising a pair of thermoelements joined to form a thermojunction and adapted for operation with a predetermined temperature gradient thereacross, each of said thermoelements having substantially homogeneous segments formed of different active materials, the material of each of said thermoelement segments having a figure of merit which is superior to that of any other material in the same thermoelement for the temperature range within said gradient obtaining across said segment when said predetermined temperature gradient obtains across said element.

5. A thermoelectric device comprising a pair of thermoelements joined to form a thermojunction and adapted for operation with a predetermined temperature gradient between the extremities of said elements, each of said elements comprising substantially homogeneous segments of different active thermoelectric materials, each material having a figure of merit superior to that of any other material in the same element at a predetermined different range of temperatures within said temperature gradient, the segments of each element being electrically joined in such order that when said predetermined temperature gradient obtains across said thermoelements, the temperature range within each segment includes a portion of the temperature range in which the figure of merit of the material thereof is superior to that of any other material in the same element.

6. A thermoelectric device comprising a P-type and an N-type thermoelement joined to form a thermojunction and adapted for operation with a predetermined temperature gradient thereacross, each of said thermoelements having substantially homogeneous segments formed of different active thermoelectric materials of like conductivity type, the material of each of said thermoelement segments having a figure of merit which is superior to that of any other material in the same thermoelement for the temperature range within said gradient obtaining across said segment when said predetermined temperature gradient obtains across said element.

7. A thermoelectric device comprising a plurality of thermoelements having first and second thermojunction means electrically joined to one and the opposite end of said thermoelements respectively, an enclosure for said thermoelements having a wall portion formed with apertures through which portions of said second thermojunction means project, and a jacket spacedly surrounding the portions of said second thermojunction means projecting from said enclosure, said jacket forming with said apertured wall portion a chamber adapted to accommodate a heat transfer fluid for thermal contact with said portions of said second thermojunction means in said chamber.

8. A thermoelectric element having portions formed of different thermoelectric materials, one of said portions being formed of a first material consisting essentially of lead and at least one member of the group tellurium, selenium and sulphur having predetermined figure of merit characteristics, and another of said portions being formed of a second material consisting essentially of lead and at least one member of the group tellurium, selenium and sulphur having predetermined figure of merit characteristics different from those of said first material.

9. A thermoelectric element having portions formed of different thermoelectric materials, one of said portions being formed of a first material consisting essentially of lead and at least one member of the group tellurium, selenium and sulphur, having predetermined figure of merit characteristics, and another of said portions being formed of a second material consisting essentially of manganese and tellurium having predetermined figure of merit characteristics different from those of said first material.

10. A thermoelectric element comprising at least two electrically joined substantially homogeneous segments formed respectively of different semiconductor materials having substantially the same base composition, the material of at least one of said segments containing a promoter agent affording said promoted material a carrier concentration different from that of the material of the other of said segments to afford said segments different figure of merit versus temperature characteristics.

11. A thermoelectric generator comprising a pair of elongated thermoelements having hot thermojunction means at one end electrically joining said thermoelements and having cold thermojunction means at the other end of each of said thermoelements, at least one of said thermoelements having portions of the length thereof respectively formed of different active thermoelectric materials, an hermetically sealed enclosure for said thermoelements having an end wall portion formed with apertures through which portions of said cold thermojunction means sealingly project, and a jacket spacedly surrounding the portions of said cold thermojunction means projecting from said enclosure, said jacket having fluid inlet and outlet connections and forming with said apertured wall portion a chamber adapted to have a cooling fluid circulated therethrough from said inlet to said outlet for cooling of said cold thermojunction means.

12. A thermoelectric generator comprising a plurality of thermoelements having hot and cold thermojunction means electrically joined to one and the opposite end of said thermoelements respectively, an hermetically sealed enclosure for said thermoelements having a wall portion formed with apertures through which portions of said cold thermojunction means sealingly project, and a jacket spacedly surrounding the portions of said cold thermojunction means projecting from said enclosure, said jacket forming with said apertured wall portion a chamber adapted to contain a cooling fluid for cooling of said cold thermojunction means.

13. A thermoelectric generator comprising a plurality of thermoelements having hot and cold thermojunction means electrically joined to one and the opposite end of said thermoelements respectively, an hermetically sealed enclosure for said thermoelements having a wall portion formed with apertures through which portions of said cold thermojunction means sealingly project, a jacket spacedly surrounding the portions of said cold thermojunction means projecting from said enclosure, said jacket forming with said apertured wall portion a chamber, and connections permitting circulation of a fluid coolant through said chamber for cooling of said cold thermojunction means.

14. A thermoelectric generator comprising a plurality of thermoelectric elements, mounting means for at least one of said elements comprising a pair of spaced wall portions between which said one element is interposed, a first contact electrode having a head portion interposed between one of said wall portions and one end of said one element, the other wall portion being apertured, a second contact electrode having a head portion interposed between the opposite spaced wall and the opposite end of said element and also having a stem portion projecting through an aperture in said other wall, deformable sealing means surrounding said stem portion at said aperture, and a helical compression spring surrounding said stem portion and interposed between the head portion of said second contact electrode and said sealing means placing said sealing means, said element and the contact between said element and said first contact electrode under compression.

15. A thermoelectric generator comprising a plurality of cylindrical thermoelectric elements, mounting means for at least one of said elements comprising a pair of spaced wall portions between which said one element is interposed, a first contact electrode having a cylindrical head portion interposed between one of said wall portions and one end of said one element, the other wall portion being apertured, a second contact electrode having a cylindrical head portion interposed between the opposite spaced wall and the opposite end of said element and also having a stem portion projecting through an aperture in said other wall, deformable sealing means surrounding said stem portion at said aperture, a helical compression spring surrounding said stem portion and interposed between the head portion of said second contact electrode and, said sealing means placing said sealing means, said element and the contact between said element and said first contact electrode under compression and an insulating sleeve snugly surrounding said element, said first and second contact electrode head portions and also surrounding said spring.

References Cited in the file of this patent

UNITED STATES PATENTS

| | | |
|---|---|---|
| 775,187 | Lyons et al. | Nov. 15, 1904 |
| 1,848,655 | Petrik | Mar. 8, 1932 |
| 2,705,746 | Strange | Apr. 5, 1955 |
| 2,858,350 | Fritts et al. | Oct. 28, 1958 |
| 2,906,801 | Fritts | Sept. 29, 1959 |
| 2,946,497 | Jarvis et al. | Aug. 16, 1960 |
| 2,961,474 | Fritts | Nov. 22, 1960 |
| 2,961,475 | Sommers | Nov. 22, 1960 |

FOREIGN PATENTS

| | | |
|---|---|---|
| 463,726 | Germany | Aug. 6, 1928 |
| 633,828 | Germany | Aug. 8, 1936 |

OTHER REFERENCES

"Journal of Applied Physics," vol. 29, No. 10, pages 1471–1473, article by Harman.

UNITED STATES PATENT OFFICE

CERTIFICATE OF CORRECTION

Patent No. 3,051,767 August 28, 1962

Russell E. Fredrick et al.

It is hereby certified that error appears in the above numbered patent requiring correction and that the said Letters Patent should read as corrected below.

Column 1, line 70, for "accompaning" read -- accompanying --; column 5, line 71, for "asignee" read -- assignee --; column 8, line 12, after "said" insert -- first --; column 10, line 34, after "and" strike out the comma.

Signed and sealed this 21st day of May 1963.

(SEAL)
Attest:

ERNEST W. SWIDER
Attesting Officer

DAVID L. LADD
Commissioner of Patents